(12) United States Patent
Jindo et al.

(10) Patent No.: US 11,295,932 B2
(45) Date of Patent: Apr. 5, 2022

(54) PLASMA GENERATION DEVICE AND PLASMA IRRADIATION METHOD

(71) Applicant: FUJI CORPORATION, Chiryu (JP)

(72) Inventors: Takahiro Jindo, Anjo (JP); Toshiyuki Ikedo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 503 days.

(21) Appl. No.: 16/317,857

(22) PCT Filed: Aug. 11, 2016

(86) PCT No.: PCT/JP2016/073684
§ 371 (c)(1),
(2) Date: Jan. 15, 2019

(87) PCT Pub. No.: WO2018/029845
PCT Pub. Date: Feb. 15, 2018

(65) Prior Publication Data
US 2021/0151293 A1    May 20, 2021

(51) Int. Cl.
*H01J 37/32*    (2006.01)

(52) U.S. Cl.
CPC ..... *H01J 37/3244* (2013.01); *H01J 2237/002* (2013.01)

(58) Field of Classification Search
CPC ............. H01J 37/3244; H01J 2237/002; H01J 37/32055; H01J 37/32825; H01H 1/36
See application file for complete search history.

(56) References Cited

U.S. PATENT DOCUMENTS

| 5,247,152 A * | 9/1993 | Blankenship ............ H05H 1/34 |
| | | 219/121.49 |
| 2013/0230990 A1* | 9/2013 | Okumura ................. H05H 1/30 |
| | | 438/778 |
| 2015/0123540 A1 | 5/2015 | Holbeche |

FOREIGN PATENT DOCUMENTS

JP    2015-516662 A    6/2015

OTHER PUBLICATIONS

International Search Report dated Oct. 18, 2016, in PCT/JP2016/073684, filed Aug. 11, 2016.

* cited by examiner

*Primary Examiner* — Yuechuan Yu
(74) *Attorney, Agent, or Firm* — Oblon, McClelland, Maier & Neustadt, L.L.P.

(57) ABSTRACT

Atmospheric-pressure plasma generation device of the present invention includes heat sinks. Flow paths are formed in the heat sinks, and cooling gas flows in the flow paths, thereby cooling lower housing in which a reaction chamber is formed. Here, the gas used for cooling is warmed by the heat of the lower housing. The warmed gas is supplied into heated gas supply device and heated by heater. The heated gas flows in lower cover and is emitted together with plasma gas from lower cover toward a processing object. Consequently, it is possible to perform cooling of the lower housing heated by electric discharge and perform heating of the processing object, and it is possible to reduce energy required for heating gas.

6 Claims, 9 Drawing Sheets

PLASMA GENERATION DEVICE AND PLASMA IRRADIATION METHOD

TECHNICAL FIELD

The present application relates to a plasma generation device that converts processing gas into plasma by using electric discharge, and a plasma irradiation method in which plasma irradiation is performed by using the plasma generation device.

BACKGROUND ART

In a plasma generation device, a voltage is applied in a reaction chamber into which processing gas is supplied, thereby generating electric discharge and converting the processing gas into plasma by the electric discharge. Here, the reaction chamber is heated by the electric discharge to a relatively high temperature. Thus, as described in the following patent literature, technology for cooling plasma generation devices has been developed.

PTL 1: Japanese Unexamined Patent Application Publication (Translation of PCT Application) No. 2015-516662

BRIEF SUMMARY

Technical Problem

According to the technology described in the aforementioned patent literature, it is possible to cool plasma generation devices heated by electric discharge. Meanwhile, it is known that the effect of plasma processing is improved by heating a processing object during the plasma processing, and thus, a plasma generation device that emits heated gas and plasma gas onto a processing object has been developed. Thus, cooling of plasma generation devices heated by electric discharge, heating of processing objects, and the like are desired in plasma generation devices. The present disclosure takes account of such circumstances, and an object of the present disclosure is to provide a plasma generation device capable of suitably cooling the plasma generation device heated by electric discharge and suitably heating a processing object.

Solution to Problem

To achieve the aforementioned object, the plasma generation device described in the present application includes a body section including a reaction chamber in which processing gas is converted into plasma by electric discharge; a cooling section including a flow path, the cooling section being configured to cool the body section by using a fluid flowing in the flow path; an emission port formed in the body section and through which plasma gas that is converted into plasma in the reaction chamber is emitted; and an emission device configured to heat the fluid used to cool the body section in the cooling section and configured to emit the heated fluid onto the plasma gas emitted from the emission port.

Advantageous Effects

The plasma generation device described in the present application includes the flow path formed in the cooling section, and fluid flows in the flow path, thereby cooling the body section in which the reaction chamber is formed. Here, the fluid used to cool the body section is warmed by the heat of the body section. The warmed fluid is further heated, and the heated fluid is emitted together with plasma gas onto a processing object. Consequently, it is possible to cool the plasma generation device heated by electric discharge and to heat the processing object while reducing energy required for heating the fluid.

DESCRIPTION OF EMBODIMENTS

As forms for carrying out the present disclosure, embodiments of the present disclosure will be described in detail with reference to the drawings.

First Embodiment

Configuration of Atmospheric-Pressure Plasma Generation Device

Figure 1:
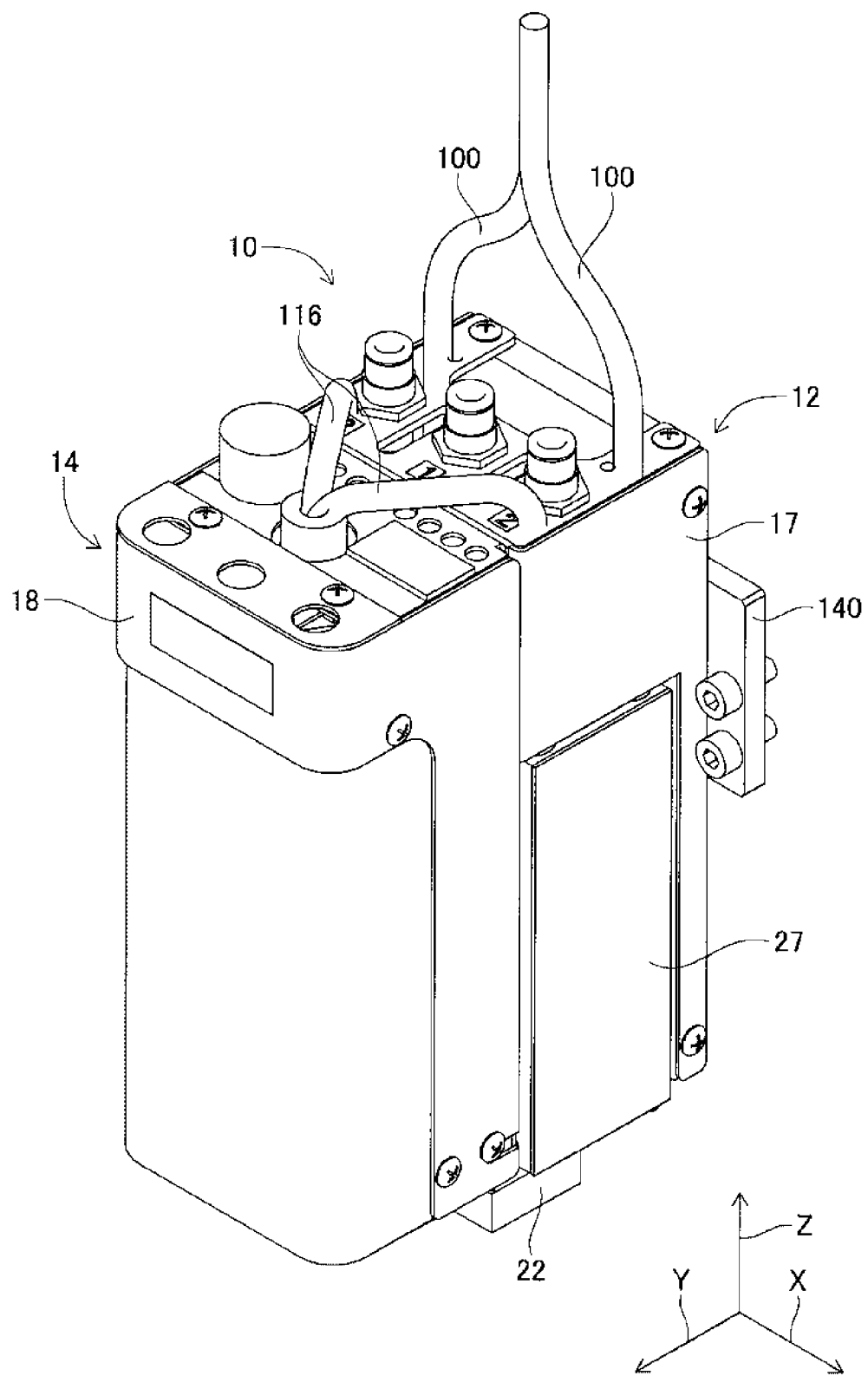
FIG. 1 is a perspective view of an atmospheric-pressure plasma generation device.
Figure 2:
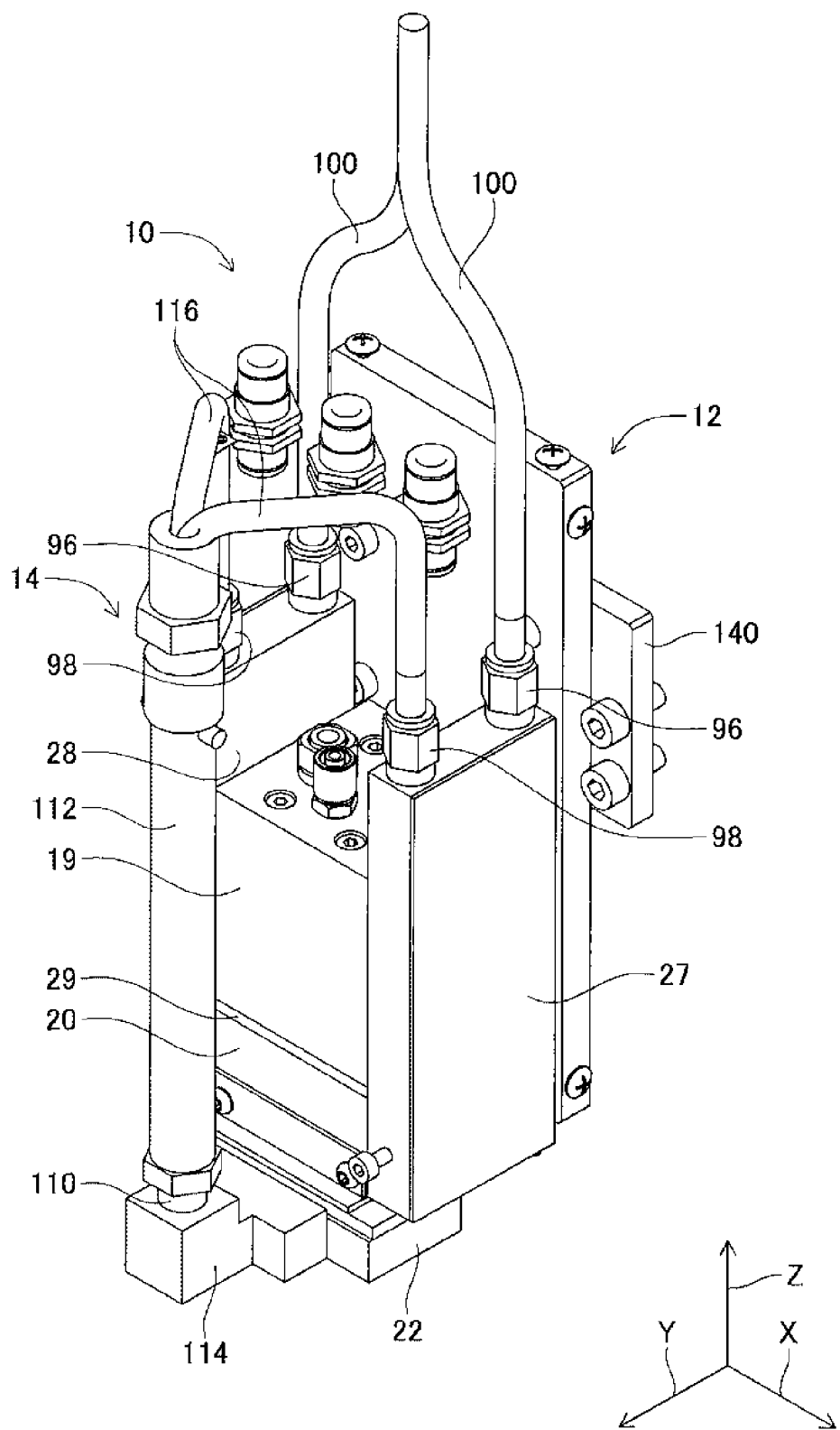
FIG. 2 is a perspective view of the atmospheric-pressure plasma generation device in a state in which protection covers are detached therefrom.
Figure 3:
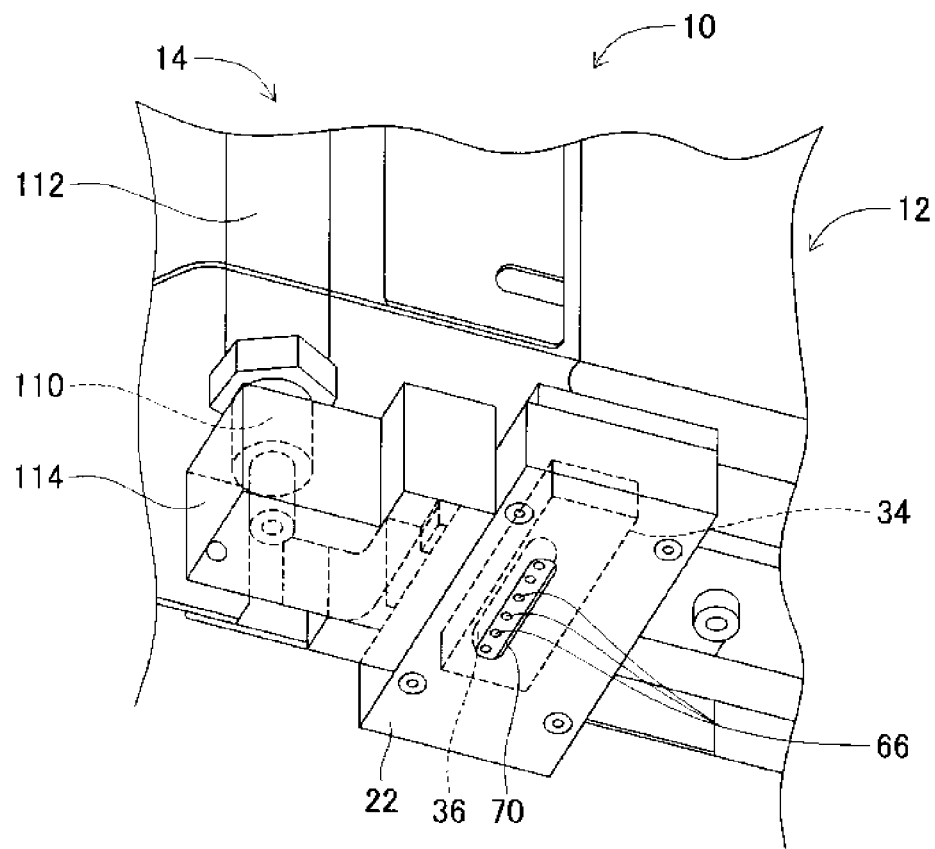
FIG. 3 is a perspective view of a lower end portion of the atmospheric-pressure plasma generation device.
Figure 4:
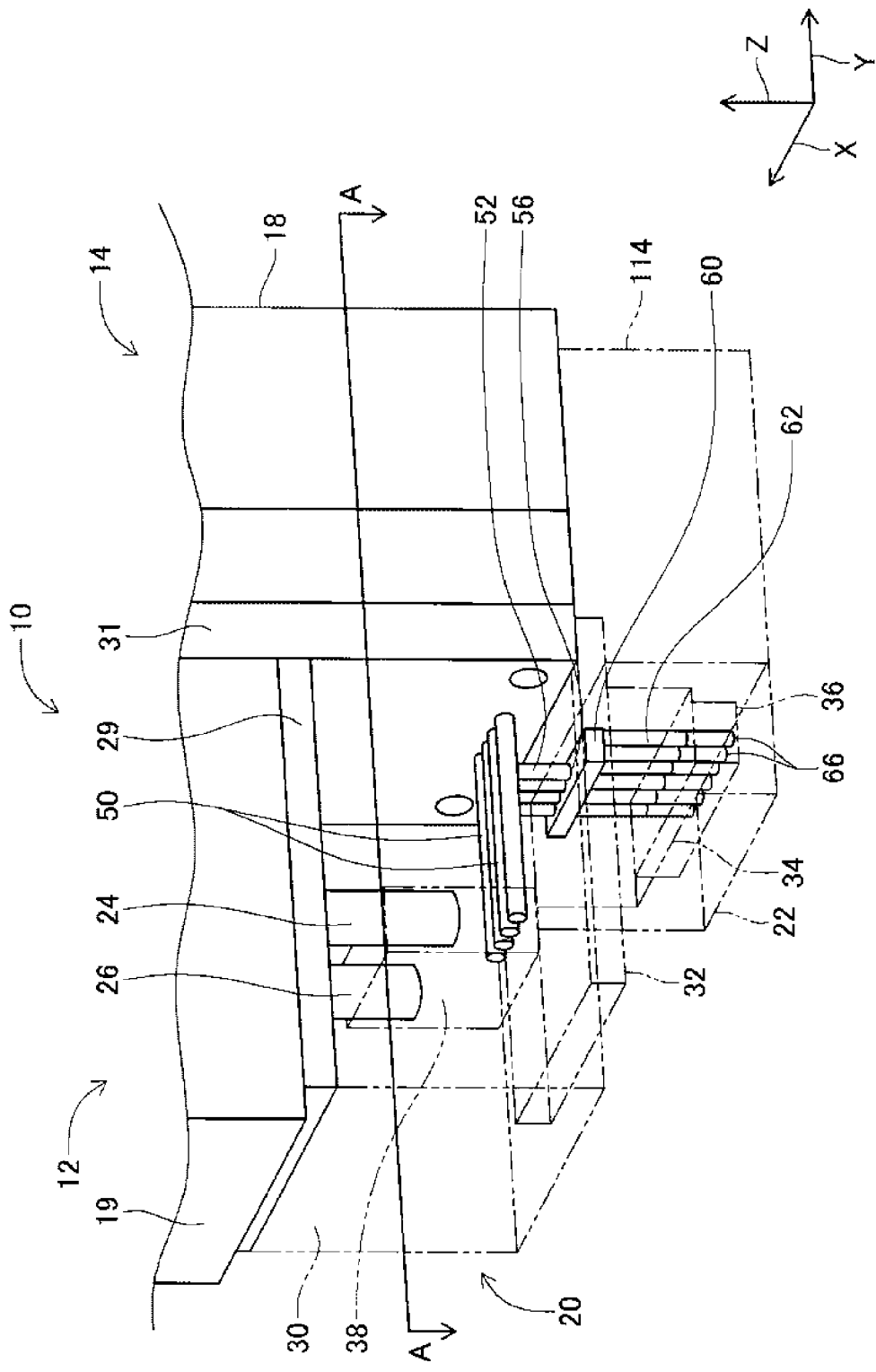
FIG. 4 is a transparent view of the lower end portion of the atmospheric-pressure plasma generation device.
Figure 5:
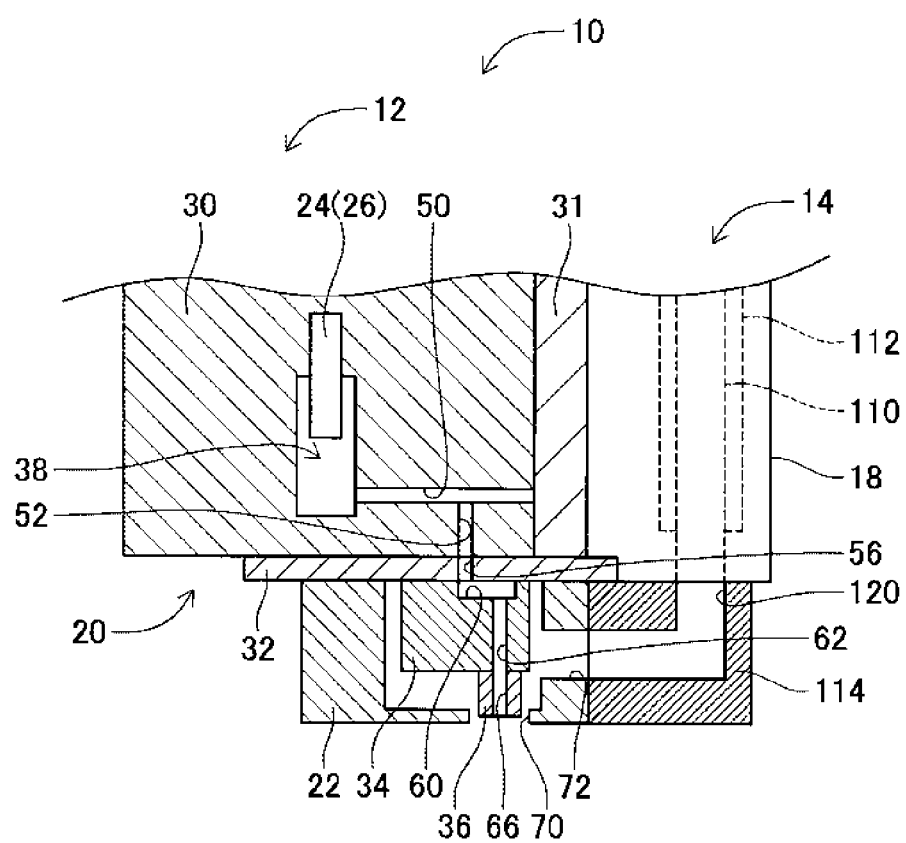
FIG. 5 is a sectional view taken along line A-A in FIG. 4.

Atmospheric-pressure plasma generation device 10 of a first embodiment of the present disclosure is illustrated in FIGS. 1 to 5. Atmospheric-pressure plasma generation device 10 is a device for generating plasma under atmospheric pressure and includes plasma gas emission device 12, heated gas supply device 14, and control device 16 (refer to FIG. 7). FIG. 1 is a perspective view of atmospheric-pressure plasma generation device 10, FIG. 2 is a perspective view of atmospheric-pressure plasma generation device 10 in a state in which protection cover 17 of plasma gas emission device 12 and protection cover 18 of heated gas supply device 14 are detached therefrom. FIG. 3 is a perspective view of a lower end portion of atmospheric-pressure plasma generation device 10 as viewed obliquely from below. FIG. 4 is a transparent view of main sections of plasma gas emission device 12. FIG. 5 is a sectional view taken along line A-A in FIG. 4. Note that the width direction of atmospheric-pressure plasma generation device 10 is referred to as the X-direction, the depth direction of atmospheric-pressure plasma generation device 10 is referred to as the Y-direction, and a direction orthogonal to the X-direction and the Y-direction, that is, the up-down direction is referred to as the Z-direction.

Plasma gas emission device 12 is constituted by protection cover 17, which is mentioned above, upper housing 19, lower housing 20, lower cover 22, a pair of electrodes 24 and 26, and a pair of heat sinks 27 and 28. Upper housing 19 and lower housing 20 are connected to each other via seal member 29 made of rubber in a state in which upper housing 19 is disposed on lower housing 20. Upper housing 19 and lower housing 20 in the connected state are held at both side surfaces thereof in the X-direction by the pair of heat sinks 27 and 28.

Lower housing 20 includes main housing 30, heat dissipation plate 31, earth plate 32, connecting block 34, and nozzle block 36. Main housing 30 has a substantially block shape, and reaction chamber 38 is formed inside main housing 30. In addition, four first gas flow paths 50 are formed in main housing 30 so as to extend in the Y-direction, and four first gas flow paths 50 are arranged adjacent to each other with a predetermined gap therebetween in the X-direction. A first end portion of each first gas flow path 50 opens in reaction chamber 38, and a second end portion thereof opens in a side surface of main housing 30 in the Y-direction. In addition, four second gas flow paths 52 are formed in main housing 30 in correspondence to four first gas flow paths 50 so as to extend in the Z-direction. An upper end portion of each second gas flow path 52 opens in first gas flow path 50 corresponding thereto, and a lower end portion thereof opens in a bottom surface of main housing 30.

Heat dissipation plate 31 is disposed on the side surface of main housing 30 in which first gas flow paths 50 open, and heat dissipation plate 31 covers openings of first gas flow paths 50 in the side surface. Heat dissipation plate 31 includes multiple fins (not illustrated) and dissipates the heat of main housing 30. Earth plate 32 functions as a lightning rod and is fixed to a lower surface of main housing 30. Four through holes 56 are formed in earth plate 32 in correspondence to four second gas flow paths 52 so as to extend therethrough in the up-down direction, and each through hole 56 is connected to second gas flow path 52 corresponding thereto.

Connecting block 34 is fixed to a lower surface of earth plate 32. Recessed section 60 is formed on an upper surface of connecting block 34 so as to extend in the X-direction, and recessed section 60 faces four through holes 56 of earth plate 32. In addition, six third gas flow paths 62 are formed in connecting block 34 so as to extend in the Z-direction, and six third gas flow paths 62 are arranged adjacent to each other with a predetermined gap therebetween in the X-direction. An upper end portion of each third gas flow path 62 opens in recessed section 60, and a lower end portion thereof opens in a bottom surface of connecting block 34. Each through hole 56 of earth plate 32 faces a first end portion of recessed section 60 of connecting block 34 in the Y-direction, and third gas flow paths 62 of connecting block 34 open in a second end portion of recessed section 60 in the Y-direction.

Nozzle block 36 is fixed to a lower surface of connecting block 34, and six fourth gas flow paths 66 are formed in correspondence to six third gas flow paths 62 of connecting block 34 so as to extend in the Z-direction. An upper end portion of each fourth gas flow path 66 is connected to third gas flow path 62 corresponding thereto, and a lower end portion thereof opens in a bottom surface of nozzle block 36. Main housing 30, connecting block 34, and nozzle block 36 are formed of a ceramic material having high heat resistance.

Lower cover 22 has a substantially square shape and is fixed to the lower surface of earth plate 32 so as to cover connecting block 34 and nozzle block 36. Through hole 70 is formed in a lower surface of lower cover 22. Through hole 70 is larger than a lower surface of nozzle block 36, and the lower surface of nozzle block 36 is positioned inside through hole 70. In addition, through hole 72 is formed in a side surface of lower cover 22 adjacent to heated gas supply device 14 so as to extend in the Y-direction. Lower cover 22 is also formed of a ceramic material having high heat resistance, similarly to main housing 30 and the like.

The pair of electrodes 24 and 26 are disposed so as to face each other inside reaction chamber 38 of main housing 30. Processing gas supply device 77 (refer to FIG. 7) is connected to reaction chamber 38 via a gas supply path (not illustrated). Processing gas supply device 77 is a device configured to supply processing gas that is formed of an activated gas such as oxygen and an inert gas such as nitrogen that are mixed together in a given ratio; processing gas supply device 77 is freely adjustable in terms of supply amount. Consequently, processing gas is supplied into reaction chamber 38 at a given flow rate (L/min).

The pair of heat sinks 27 and 28 are substantially rectangular, and heat sinks 27 and 28 each have a longitudinal length dimension longer than the total length dimension of upper housing 19 and main housing 30 in the connected state in the Z-direction. The pair of heat sinks 27 and 28 are fixed, in an orientation extending in the up-down direction, to both side surfaces of upper housing 19 and main housing 30 in the connected state in the X-direction. Heat sinks 27 and 28 each have an upper end portion extending above an upper end surface of upper housing 19.

Figure 6:
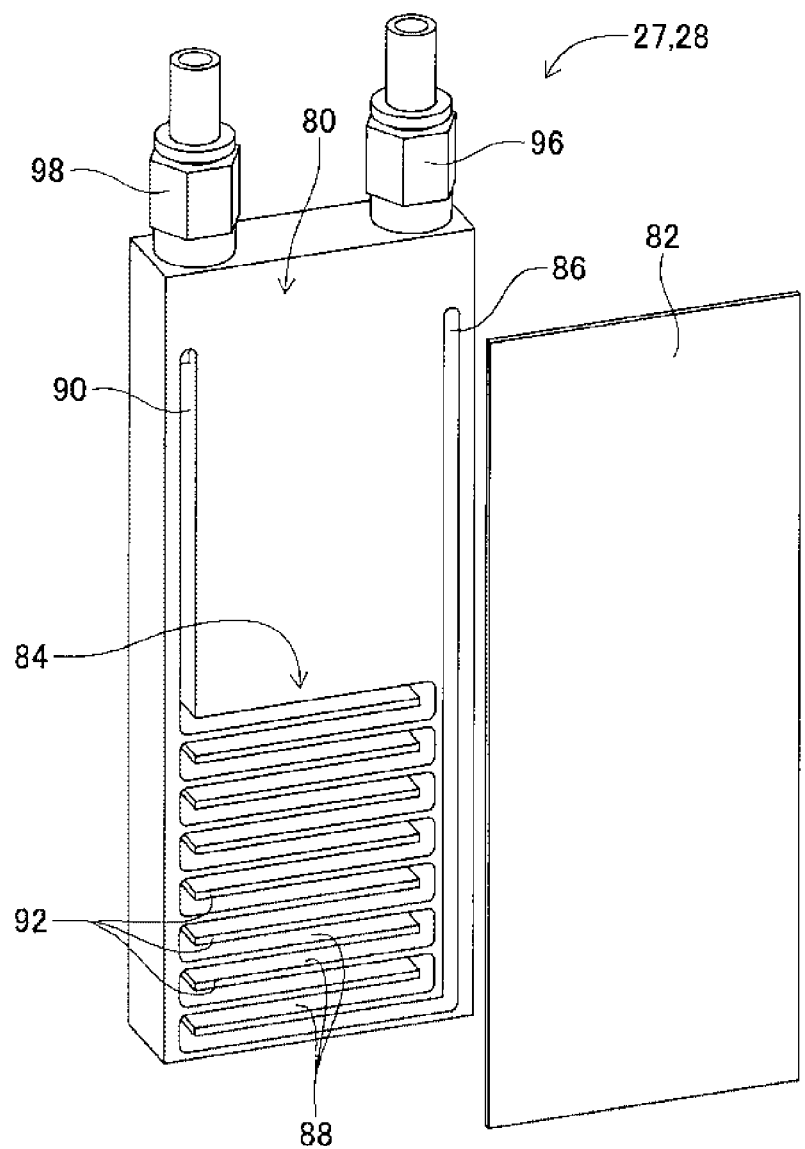
FIG. 6 is an exploded perspective view of a heat sink.

As illustrated in FIG. 6, heat sinks 27 and 28 each include body section 80 and cover section 82. Body section 80 is a substantially rectangular member having a plate thickness and is disposed upright in an orientation extending in the up-down direction. Flow path 84 is formed on a side surface of body section 80 in the thickness direction. Flow path 84 is constituted by supply path 86, winding path 88, and discharge path 90. Supply path 86 is formed so as to extend in the longitudinal direction, that is, in the up-down direction at one end portion side of body section 80 in a direction orthogonal to the longitudinal direction, which is called the transverse direction. An upper end portion of supply path 86 opens in an upper end surface of body section 80, while a lower end portion thereof does not open in a lower end surface of body section 80 and stops just before reaching the lower end surface of body section 80.

Winding path 88 is connected at a first end portion thereof to the lower end of supply path 86 and extends in the transverse direction away from supply path 86. An extending-side end portion thereof slightly winds upward before reaching a side surface of body section 80 and extends again in the transverse direction toward supply path 86. Further, the extending-side end portion thereof slightly winds upward before reaching supply path 86 and extends again in the transverse direction away from supply path 86. Thus, winding path 88 winds upward from a lower end portion of body section 80 such that approaching and moving away from supply path 86 in the transverse direction are repeated. In other words, winding path 88 winds from a lower part toward an upper part in a state of being layered into multiple layers in the left-right direction. Winding path 88 winding into the multiple layers in the left-right direction is partitioned by thin ribs 92, and the thickness of each rib 92 is approximately 1 mm.

A second end portion of winding path 88 is positioned slightly below a center portion of body section 80 in the longitudinal direction, that is, in the up-down direction and stops just before reaching the side surface on the side opposite to supply path 86 in the transverse direction of body section 80. In other words, winding path 88 is formed at a portion below the center portion of body section 80 in the up-down direction in a state of winding upward from a lower part of body section 80 into the multiple layers. Discharge path 90 is formed on the side opposite to supply path 86 in the transverse direction so as to extend in the up-down direction. An upper end portion of discharge path 90 opens in the upper end surface of body section 80, and a lower end portion thereof is connected to the second end portion of winding path 88. Consequently, supply path 86, winding path 88, and discharge path 90 are connected together, thereby constituting flow path 84. Supply-side joint 96 is connected to the opening of supply path 86 in the upper end surface of body section 80, and discharge-side joint 98 is connected to the opening of discharge path 90 in the upper end surface of body section 80.

Cover sections 82 of heat sinks 27 and 28 each have a plate shape and have dimensions identical to those of the side surface of body section 80 on which flow path 84 is formed. The thickness of cover section 82 is thin, that is, approximately 1 mm. Cover section 82 is fixed to the side surface of body section 80 on which flow path 84 is formed so as to cover flow path 84. As described above, heat sinks 27 and 28 are fixed to the side surfaces of upper housing 19 and main housing 30 that are connected to each other; incidentally, heat sinks 27 and 28 are fixed to the side surfaces of upper housing 19 and main housing 30 that are connected to each other such that winding paths 88 formed in body sections 80 coincide in the up-down direction with the side surfaces of main housing 30 and lower portions of the side surfaces of upper housing 19. In other words, lower half portions of heat sinks 27 and 28 in which winding paths 88 are formed are fixed to the side surfaces of main housing 30 and the lower portions of the side surfaces of upper housing 19. As illustrated in FIG. 1, cutout portions are formed in protection cover 17 of plasma gas emission device 12, and heat sinks 27 and 28 are exposed from the cutout portions.

As illustrated in FIG. 2, supply pipe 100 is connected to supply-side joints 96 of the pair of heat sinks 27 and 28. Supply pipe 100 is bifurcated at a first end portion thereof, and these bifurcated end portions are connected to supply-side joints 96 of the pair of heat sinks 27 and 28. A second end portion of supply pipe 100 is not bifurcated and is connected to cooling gas supply device 102 (refer to FIG. 7). Cooling gas supply device 102 is a device that is configured to supply air at approximately room temperature as cooling gas and is freely adjustable in terms of supply amount. Consequently, cooling gas is supplied at a given flow rate (L/min) into the pair of heat sinks 27 and 28.

As illustrated in FIG. 1 and FIG. 2, heated gas supply device 14 includes protection cover 18, which is mentioned above, gas pipe 110, heater 112, and connecting block 114. Protection cover 18 is disposed so as to cover heat dissipation plate 31 of plasma gas emission device 12. Gas pipe 110 is disposed inside protection cover 18 so as to face heat dissipation plate 31 and so as to extend in the up-down direction. Gas pipe 110 is connected at an upper end portion thereof via discharge pipe 116 to discharge-side joints 98 of the pair of heat sinks 27 and 28. Discharge pipe 116 is bifurcated at a first end portion thereof, and these bifurcated end portions are connected to discharge-side joints 98 of the pair of heat sinks 27 and 28. A second end portion of discharge pipe 116 is not bifurcated and is connected to the upper end of gas pipe 110. Consequently, the gas discharged from the pair of heat sinks 27 and 28 is supplied into gas pipe 110. Heater 112 having a substantially cylindrical shape is disposed on the outer circumferential surface of gas pipe 110, and gas pipe 110 is heated by heater 112. Consequently, the gas supplied into gas pipe 110 from heat sinks 27 and 28 is heated.

Connecting block 114 is connected to the lower end of gas pipe 110 and fixed to a side surface of lower cover 22 adjacent to heated gas supply device 14 in the Y-direction. As illustrated in FIG. 5, connecting path 120 that winds into a substantially L shape is formed in connecting block 114; a first end portion of connecting path 120 opens in an upper surface of connecting block 114, and a second end portion of connecting path 120 opens in a side surface adjacent to plasma gas emission device 12 in the Y-direction. The first end portion of connecting path 120 is connected to the lower end of gas pipe 110, and the second end portion of connecting path 120 is connected to through hole 72 of lower cover 22. Consequently, the gas heated in gas pipe 110 is supplied into lower cover 22.

Figure 7:
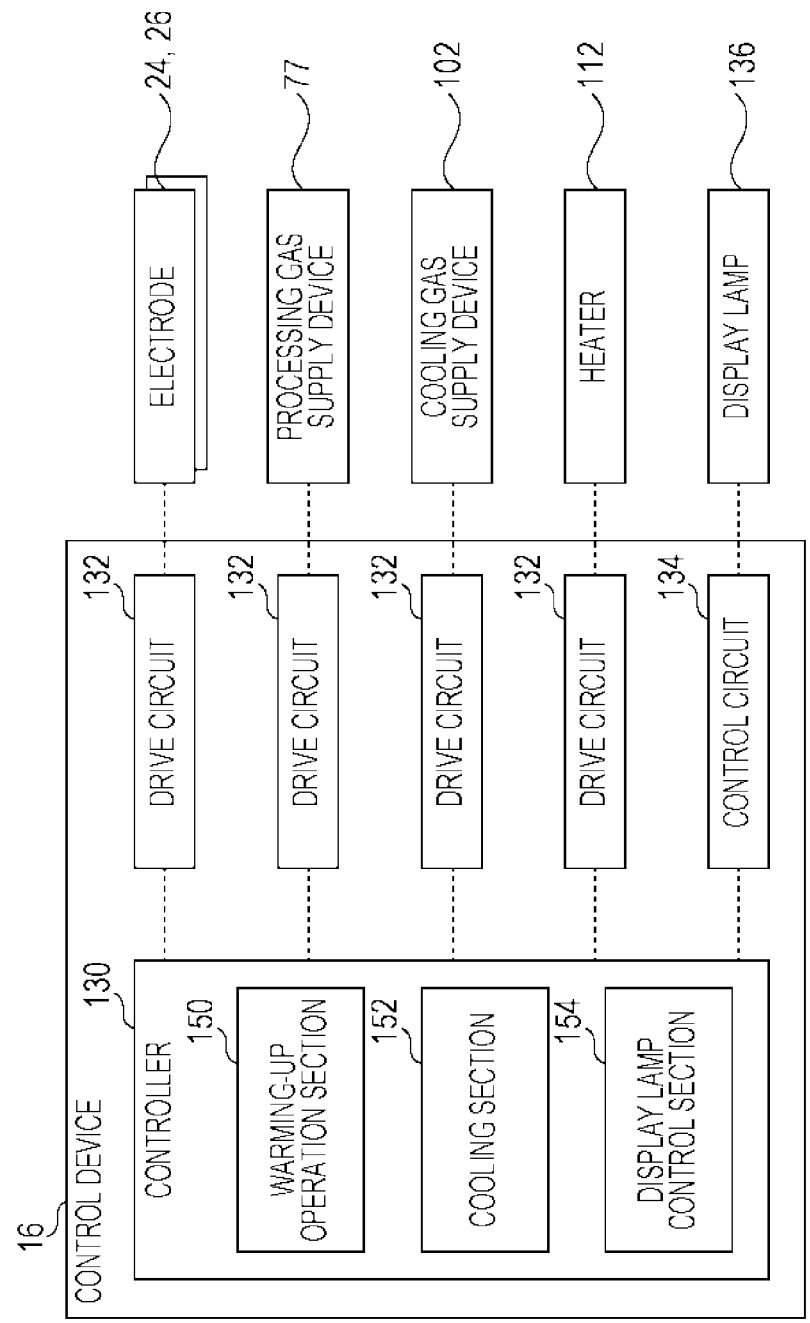
FIG. 7 is a block diagram of a control device.

As illustrated in FIG. 7, control device 16 is provided with controller 130, multiple drive circuits 132, and control circuit 134. Multiple drive circuits 132 are connected to electrodes 24 and 26, processing gas supply device 77, cooling gas supply device 102, and heater 112, which are mentioned above. Controller 130 is provided with a CPU, a ROM, a RAM, and the like and mainly constituted by a computer, and controller 130 is connected to multiple drive circuits 132. Consequently, operation of plasma gas emission device 12 and heated gas supply device 14 is controlled by controller 130. Controller 130 is connected also to display lamp 136 via control circuit 134. Display lamp 136, which will be described later, is a lamp that is configured to indicate that plasma irradiation with respect to a processing object is available; display lamp 136 is turned on so as to be controllable by controller 130.

As illustrated in FIG. 1 and FIG. 2, fixing mechanism 140 is disposed on a side surface of plasma gas emission device 12 opposite to the side surface on which heated gas supply device 14 is disposed. Fixing mechanism 140 is a mechanism for fixing atmospheric-pressure plasma generation device 10 to a predetermined location, and atmospheric-pressure plasma generation device 10 irradiates a processing object with plasma by being fixed to the predetermined location by fixing mechanism 140.

Plasma Processing by Atmospheric-Pressure Plasma Generation Device

In plasma gas emission device 12 of atmospheric-pressure plasma generation device 10, due to the aforementioned configuration, the processing gas inside reaction chamber 38 is converted into plasma, and plasma gas is emitted from the lower ends of fourth gas flow paths 66 of nozzle block 36. Gas that is heated by heated gas supply device 14 is supplied into lower cover 22. The plasma gas is emitted together with the heated gas from through hole 70 of lower cover 22, and a processing object is thereby subjected to plasma processing. Note that, in atmospheric-pressure plasma generation device 10, a warming-up operation of plasma gas emission device 12 is performed before a processing object is subjected to plasma processing. This is because, if plasma gas emission device 12, in particular, main housing 30 is not sufficiently warmed, it is not possible to suitably convert the processing gas into plasma in reaction chamber 38, and plasma generation performance is thus low. Plasma processing performed by atmospheric-pressure plasma generation device 10 will be described below in detail.

As described above, the warming-up operation is performed in plasma gas emission device 12 before a processing object is subjected to plasma processing. In the warming-up operation, processing gas is first supplied into reaction chamber 38 by processing gas supply device 77. Here, the amount of the processing gas supplied per unit of time is approximately 10 L/min. While the processing gas is supplied into reaction chamber 38, a voltage is applied to the pair of electrodes 24 and 26 in reaction chamber 38, and current flows between the pair of electrodes 24 and 26. Consequently, electric discharge is generated between the pair of electrodes 24 and 26, and the processing gas is converted into plasma by the electric discharge. Here, reaction chamber 38 is heated by the electric discharge, and main housing 30 is warmed. A period required for the temperature of main housing 30 to reach a predetermined temperature is set, and the warming-up operation is continuously performed for the set period. Consequently, main housing 30 is warmed up to the predetermined temperature, and the plasma generation performance of plasma gas emission device 12 is sufficiently enhanced.

As a result of the warming-up operation of plasma gas emission device 12 being continuously performed for the set period, the warming-up operation is completed, and display lamp 136 is turned on by controller 130. As described above, display lamp 136 is a lamp for indicating that plasma irradiation with respect to a processing object is available; an operator confirms that display lamp 136 is turned on and sets a processing object below through hole 70 of lower cover 22 of plasma gas emission device 12.

When the warming-up operation of plasma gas emission device 12 is completed, the amount of the processing gas supplied by processing gas supply device 77 is increased. Specifically, the amount of the processing gas supplied per unit of time by processing gas supply device 77 is increased from approximately 10 L/min to approximately 60 L/min. Application of the voltage to electrodes 24 and 26 is continued even after the warming-up operation is completed. Here, as a result of the voltage being applied to electrodes 24 and 26, plasma is generated in reaction chamber 38, and the generated plasma flows inside first gas flow paths 50 in the Y-direction. The plasma then flows downward inside second gas flow paths 52 and through holes 56 and flows into recessed section 60. Further, the plasma flows inside recessed section 60 in the Y-direction and flows downward inside third gas flow paths 62 and fourth gas flow paths 66. Consequently, plasma gas is emitted from the lower end of fourth gas flow paths 66.

Main housing 30 is sufficiently warmed due to the warming-up operation, and the processing gas is suitably converted into plasma in reaction chamber 38; however, as a result of the voltage being continuously applied to electrodes 24 and 26, reaction chamber 38 is excessively heated. Specifically, main housing 30 is warmed to approximately 100 to 150° C. due to the warming-up operation; however, main housing 30 is heated to 200° C. or higher due to the voltage application after the warming-up operation. When main housing 30 is thus heated to 200° C. or higher, electrodes 24 and 26, an inner portion of the reaction chamber, and the like may deteriorate as a result of being carbonized. Considering such a circumstance, in atmospheric-pressure plasma generation device 10, cooling gas is supplied by cooling gas supply device 102 into the pair of heat sinks 27 and 28 when the warming-up operation of plasma gas emission device 12 is completed.

The cooling gas supplied into heat sinks 27 and 28 flows in flow paths 84 formed inside heat sinks 27 and 28, heat sinks 27 and 28 are thereby cooled, and upper housing 19 and main housing 30 to which heat sinks 27 and 28 are fixed are thus cooled. In particular, flow paths 84 in which the cooling gas flows is formed inside heat sinks 27 and 28 in the state of winding into the multiple layers, and the surface area of flow paths 84 is thereby increased. In other words, as a result of flow paths 84 being layered into the multiple layers, the surface area of flow paths 84 inside heat sinks 27 and 28 is increased. Moreover, corner portions of flow paths 84 are chamfered, and the chamfering further increases the surface area of flow paths 84. Thus, the cooling effect exerted by heat sinks 27 and 28 is increased, and upper housing 19 and main housing 30 are effectively cooled. In addition, the chamfering of the corner portions of flow paths 84 assures the flow rate of the cooling gas flowing in flow paths 84, and the cooling gas thus flows in flow paths 84 in a state of being rectified. Consequently, the cooling effect exerted by heat sinks 27 and 28 is further increased.

As a result of the cooling gas flowing in flow paths 84 and thereby cooling upper housing 19 and main housing 30, the cooling gas flowing in flow path 84 is warmed, and the cooling effect exerted by heat sinks 27 and 28 may be decreased. Thus, as described above, winding paths 88 of flow paths 84 are formed in regions in the lower half portions of heat sinks 27 and 28, and the lower half portions of heat sinks 27 and 28 are fixed to the side surfaces of main housing 30 and the lower portions of the side surfaces of upper housing 19. Thus, it is possible to efficiently cool main housing 30 and a lower portion of upper housing 19, which are heated to a high temperature due to the heat of reaction chamber 38, by using the cooling gas and to immediately discharge the cooling gas that has been warmed as a result of the cooling from the inside of heat sinks 27 and 28. Consequently, it is possible to suppress a decrease in the cooling effect due to warmed cooling gas.

Specifically, in heat sinks 27 and 28, the cooling gas flows toward lower end portions of heat sinks 27 and 28 via supply paths 86, and, from the lower end portions thereof, the cooling gas flows upward via winding paths 88 from the lower end portions while winding in the left-right direction. The lower end portions of heat sinks 27 and 28 are fixed to the side surfaces of main housing 30. Thus, the cooling gas in a state of not being warmed by main housing 30 and the like, that is, the cooling gas in a state of having the lowest temperature flows toward reaction chamber 38 of main housing 30, and the cooling gas in a state of being warmed as a result of cooling main housing 30 flows away from reaction chamber 38. Consequently, it is possible to effectively cool main housing 30, which is heated mostly by the heat of reaction chamber 38, and it is possible by separating the cooling gas in the state of being warmed as a result of cooling main housing 30 from reaction chamber 38 to suppress the cooling effect from decreasing.

In heat sinks 27 and 28, the thickness of each rib 92 partitioning multi-layered winding paths 88 is approximately 1 mm, and the thickness of each cover section 82 covering flow path 84 is also approximately 1 mm. As a result of partitioning flow path 84 with such comparatively thin members, heat does not easily remain inside heat sinks 27 and 28, and the dissipation effect is thus increased. Consequently, it is possible to increase the cooling effect exerted by heat sinks 27 and 28.

As described above, atmospheric-pressure plasma generation device 10 is capable of maintaining the temperature of main housing 30 at 100 to 150° C. by using heat sinks 27 and 28 that exert the high cooling effect. In addition, as described above, air at approximately room temperature is supplied as cooling gas into heat sinks 27 and 28 from supply pipe 100; however, as the cooling gas is warmed in heat sinks 27 and 28 by main housing 30 and the like, the temperature of the cooling gas discharged from heat sinks 27 and 28 is 80 to 100° C. The warmed gas is heated in heated gas supply device 14 and emitted onto a processing object together with plasma that is emitted by plasma gas emission device 12.

Specifically, the gas warmed in heat sinks 27 and 28 is discharged from discharge path 90 and supplied via discharge pipe 116 into gas pipe 110 of heated gas supply device 14. Here, the gas is heated in gas pipe 110 by heater 112 to approximately 700° C. or higher. The heated gas is discharged from gas pipe 110 and flows into lower cover 22 from through hole 72 via connecting path 120 of connecting block 114. The heated gas flowed into lower cover 22 is then emitted from through hole 70. Here, the plasma gas emitted from the lower ends of fourth gas flow paths 66 of nozzle block 36 is protected by the heated gas.

Specifically, in an existing atmospheric-pressure plasma generation device, plasma gas is emitted into the air during plasma processing, and a processing object is irradiated with the plasma gas emitted into the air. Here, the plasma gas is reacted in the air with activated gas such as oxygen, and ozone is thereby generated. The plasma gas is thus deactivated, and plasma processing may not be appropriately performed. In contrast, in atmospheric-pressure plasma generation device 10, nozzle block 36 configured to emit plasma gas is covered with lower cover 22, and heated gas is supplied into lower cover 22. Consequently, when plasma gas is emitted from through hole 70 of lower cover 22, the heated gas is emitted together with the plasma gas so as to surround the circumference of the emitted plasma gas. The heated gas has been heated by heater 112 to approximately 700° C. or higher, and the heated gas emitted from through hole 70 has a temperature of 250° C. or higher. Ozone is decomposed at a temperature of 200° C. or higher, and therefore, the plasma gas surrounded by the heated gas is suppressed from being ozonized. Consequently, the plasma gas is suppressed from being deactivated, and it is thus possible to perform plasma processing appropriately. Moreover, in atmospheric-pressure plasma generation device 10, heated gas having a temperature of 200° C. or higher is emitted together with plasma gas onto a processing object; therefore, the processing object and the like are heated by the heated gas, and the heated processing object is subjected to plasma processing. Consequently, reactivity of the processing object is improved, and it is thus possible to perform the plasma processing effectively.

Thus, atmospheric-pressure plasma generation device 10 assures appropriate and effective plasma processing by emitting heated gas together with plasma gas. In addition, in atmospheric-pressure plasma generation device 10, the gas warmed as a result of being used to cool main housing 30 and the like is heated in heated gas supply device 14. In other words, gas having approximately room temperature is supplied into heat sinks 27 and 28 and is warmed to approximately 80 to 100° C. as a result of cooling main housing 30 and the like. The gas having the temperature of 80 to 100° C. is then heated to 700° C. or higher by heater 112 of heated gas supply device 14. Consequently, it is possible to reduce energy for heating gas.

As described above, in atmospheric-pressure plasma generation device 10, cooling gas is supplied into heat sinks 27 and 28 after the warming-up operation is completed, and cooling of main housing 30 and the like by heat sinks 27 and 28 is started. Consequently, it is possible to suppress main housing 30 and the like from being cooled during the warming-up operation, and it is thus possible to perform the warming-up operation appropriately. Moreover, the amount of the processing gas supplied per unit of time into reaction chamber 38 during the warming-up operation is set to be less than the amount of the processing gas supplied per unit of time into reaction chamber 38 while a processing object is irradiated with plasma. Thus, during plasma irradiation with respect to a processing object, the processing object is irradiated with a large amount of gas that is heated and converted into plasma, and during the warming-up operation, the gas that is heated and converted into plasma is not easily emitted from plasma gas emission device 12. Consequently, it is possible to suppress the gas that is heated and converted into plasma from being emitted during a warming-up operation, and it is thus possible to perform the warming-up operation efficiently.

As illustrated in FIG. 7, controller 130 includes warming-up operation section 150, cooling section 152, and display lamp control section 154. Warming-up operation section 150 is a functional section for performing a warming-up operation of plasma gas emission device 12. Cooling section 152 is a functional section for starting cooling by heat sinks 27 and 28 after a warming-up operation is completed. Display lamp control section 154 is a functional section for notifying, after a warming-up operation is completed, that plasma processing is startable.

Second Embodiment

Figure 8:
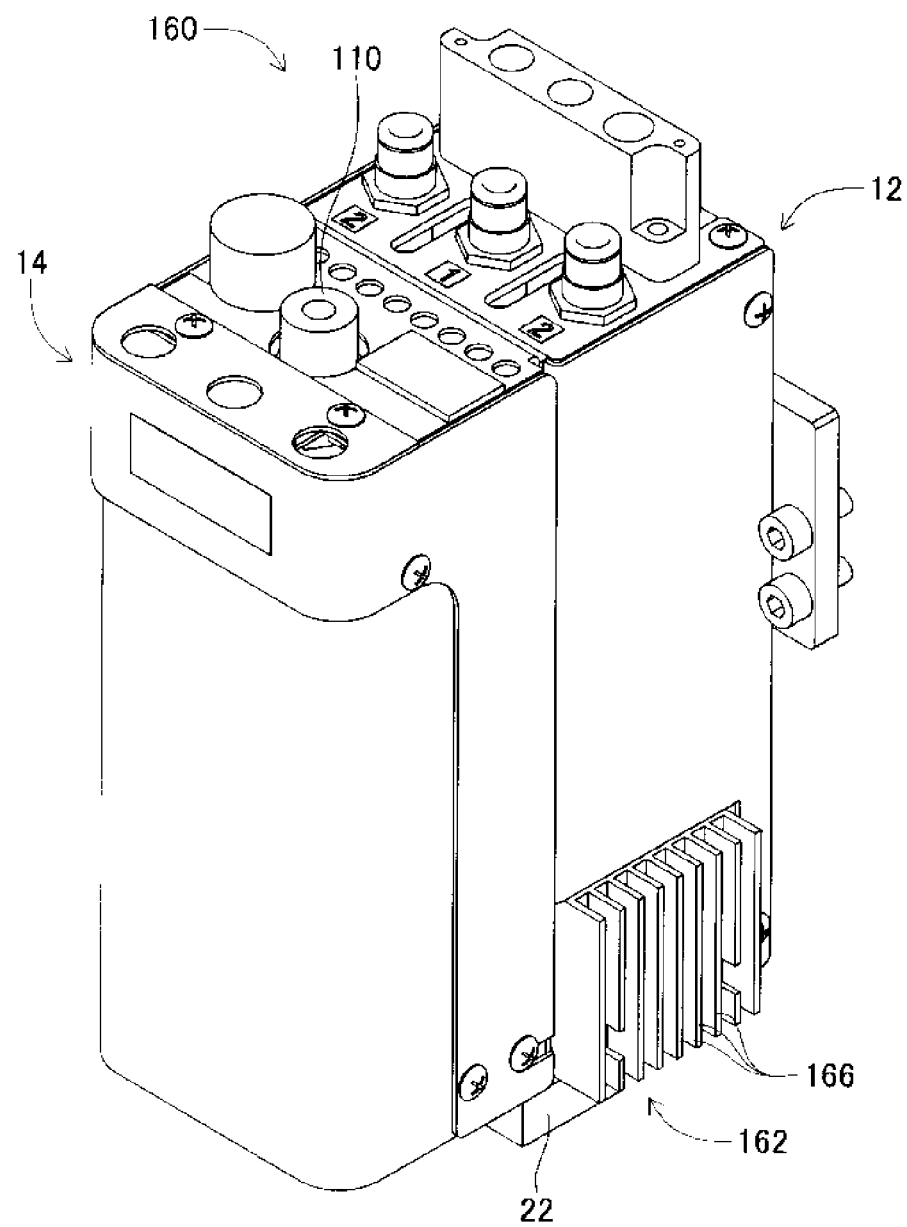
FIG. 8 is a perspective view of an atmospheric-pressure plasma generation device in a second embodiment.
Figure 8:
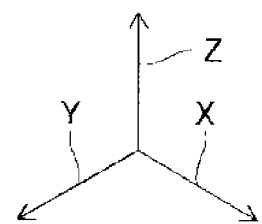

Atmospheric-pressure plasma generation device 160 of a second embodiment is illustrated in FIG. 8. Atmospheric-pressure plasma generation device 160 of the second embodiment has a configuration substantially identical, except for heat sinks 162, to that of atmospheric-pressure plasma generation device 10 of the first embodiment. Thus, heat sinks 162 will be described, and description of other components will be omitted or will be provided briefly by using the identical reference signs of the components of atmospheric-pressure plasma generation device 10 of the first embodiment.

Atmospheric-pressure plasma generation device 160 of the second embodiment includes a pair of heat sinks (only one of the pair of heat sinks 162 is illustrated in FIG. 8) 162. Each heat sink 162 is constituted by a base portion (not illustrated) and fins 166. The pair of heat sinks 162 are fixed at the base portions to both side surfaces of main housing 30 in the X-direction. Cutout portions are formed in protection cover 17 covering the side surfaces of main housing 30, and fins 166 of heat sinks 162 extend from the cutout portions to the outside. Consequently, the heat of main housing 30 is naturally cooled due to heat sinks 162.

Note that, in atmospheric-pressure plasma generation device 160, gas having approximately room temperature is supplied directly from cooling gas supply device 102 into gas pipe 110 of heated gas supply device 14. The gas supplied into gas pipe 110 is heated to 700° C. or higher by heater 112. Main housing 30 is provided with a temperature sensor (not illustrated) configured to detect the temperature of main housing 30, and a detection value obtained by the temperature sensor is input into controller 130.

Similarly to atmospheric-pressure plasma generation device 10 of the first embodiment, a warming-up operation is performed also in atmospheric-pressure plasma generation device 160 having such a configuration. Note that, in atmospheric-pressure plasma generation device 160, heated gas supply device 14 is operated during a warming-up operation. Specifically, similarly to atmospheric-pressure plasma generation device 10 of the first embodiment, processing gas is supplied into reaction chamber 38 by processing gas supply device 77 even during a warming-up operation in atmospheric-pressure plasma generation device 160. Here, the amount of the processing gas supplied per unit of time is approximately 10 L/min. While the processing gas is supplied into reaction chamber 38, a voltage is applied to the pair of electrodes 24 and 26 in reaction chamber 38, and current flows between the pair of electrodes 24 and 26. Consequently, electric discharge is generated between the pair of electrodes 24 and 26, and the processing gas is converted into plasma by the electric discharge. Here, reaction chamber 38 is heated by the electric discharge, and main housing 30 is warmed.

In parallel with supplying of processing gas into reaction chamber 38 and voltage application to electrodes 24 and 26, gas is supplied into gas pipe 110 by cooling gas supply device 102 and gas pipe 110 is heated by heater 112 in heated gas supply device 14. Here, the gas is heated to 700° C. or higher in gas pipe 110, and the heated gas flows into lower cover 22. Consequently, lower cover 22 is heated by the heated gas, and the heat of lower cover 22 is transmitted to main housing 30 via earth plate 32. The warming-up operation is thus efficiently performed in atmospheric-pressure plasma generation device 160 as a result of main housing 30 being warmed due to heating by electric discharge and the heat transmitted from lower cover 22.

In atmospheric-pressure plasma generation device 160, the temperature of main housing 30 is detected by the temperature sensor, and thus, the warming-up operation is completed when a detected temperature of main housing 30 is a predetermined temperature, for example, 150° C. When the warming-up operation is completed, display lamp 136 is turned on by controller 130. Consequently, an operator confirms that display lamp 136 is turned on, and the operator sets a processing object below through hole 70 of lower cover 22 of plasma gas emission device 12.

Similarly to atmospheric-pressure plasma generation device 10 of the first embodiment, the amount of processing gas supplied by processing gas supply device 77 is increased when a warming-up operation of plasma gas emission device 12 is completed. Specifically, the amount of processing gas supplied per unit of time by processing gas supply device 77 is increased from approximately 10 L/min to approximately 60 L/min. Consequently, it is possible to irradiate a processing object with a large amount of plasma gas. Heated gas supply device 14 is operated during plasma irradiation also in atmospheric-pressure plasma generation device 160, and heated gas is emitted together with plasma gas onto a processing object. Consequently, an effect similar to that of atmospheric-pressure plasma generation device 10 of the first embodiment can be exerted also in atmospheric-pressure plasma generation device 160.

Even when plasma irradiation with respect to a processing object is stopped, the warming-up operation is preferably performed during a stoppage period unless the stoppage period is long. It is possible to restart plasma irradiation immediately by thus performing the warming-up operation during the stoppage period. When the stoppage period is short, for example, when the stoppage period is approximately a few tens of seconds, only emission of heated gas by heated gas supply device 14 may be performed without performing supplying of processing gas by processing gas supply device 77 and without voltage application to electrodes 24 and 26. In other words, when the stoppage period is comparatively short, it is possible to maintain the warming-up state of plasma gas emission device 12 by performing only emission of heated gas by heated gas supply device 14.

Incidentally, in the aforementioned embodiments, atmospheric-pressure plasma generation device 10 is an example of the plasma generation device. Heated gas supply device 14 is an example of the emission device. Heat sinks 27 and 28 are an example of the cooling section. Main housing 30 is an example of the body section. Reaction chamber 38 is an example of the reaction chamber. Fourth gas flow paths 66 are an example of the emission port. Fixing mechanism 140 is an example of the attachment section.

Figure 9:
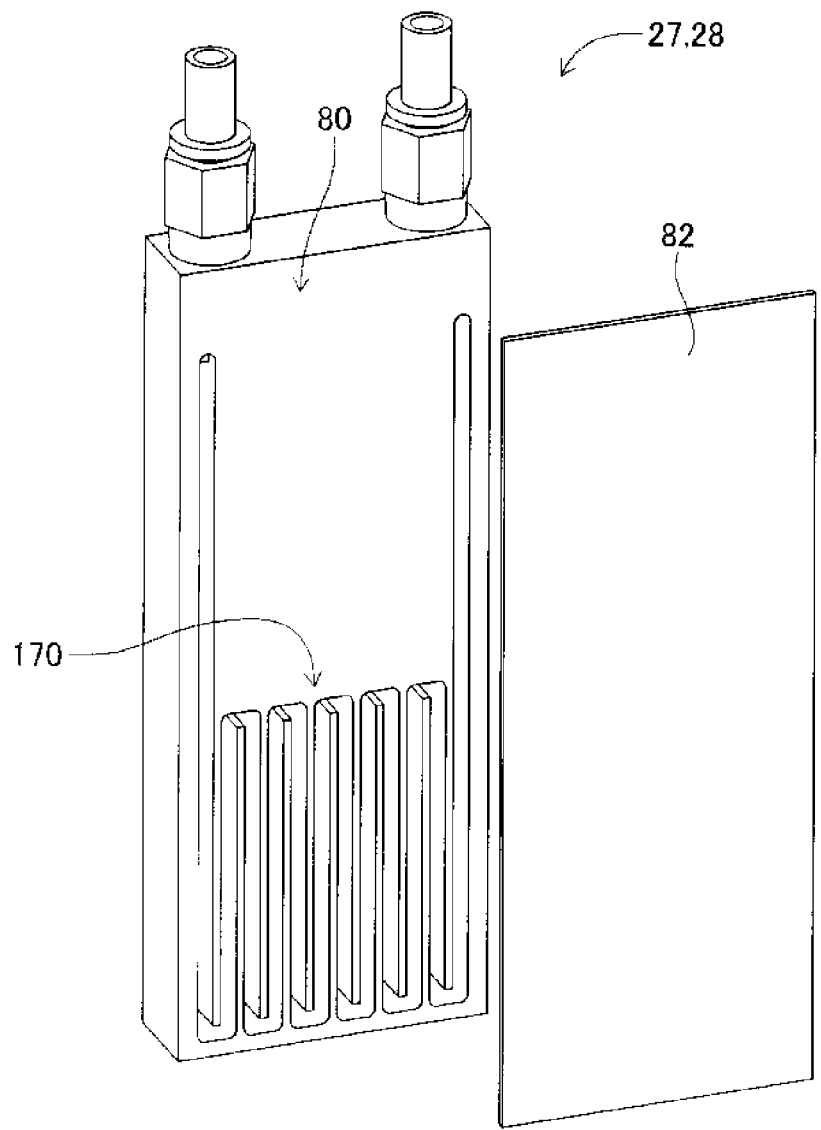
FIG. 9 is an exploded perspective view of a heat sink in an alternative embodiment.

Note that the present disclosure is not limited to the aforementioned embodiments and can be carried out in various forms subjected to various modifications and improvements based on the knowledge of a person skilled in the art. Specifically, for example, flow paths 84 in the state of winding into the multiple layers in the left-right direction are formed in body sections 80 of heat sinks 27 and 28 in the aforementioned embodiments; however, flow paths 170 in a state of winding into multiple layers in the up-down direction, as illustrated in FIG. 9, may be formed in body sections 80 of heat sinks 27 and 28. In addition, flow paths 84 and flow paths 170 are formed in regions in the lower half portions of body sections 80; however, flow paths may be formed on the entire surfaces of body sections 80.

In addition, in the aforementioned first embodiment, flow paths 84 are formed inside heat sinks 27 and 28 that are fixed to the side surfaces of upper housing 19 and main housing 30; however, flow paths may be formed in main housing 30 and the like. Consequently, it is possible to cool main housing 30 and the like directly. Moreover, fluid, not limited to gas, may be allowed to flow in the flow paths.

REFERENCE SIGNS LIST 10 atmospheric-pressure plasma generation device (plasma generation device)
14 heated gas supply device (emission device)
27 heat sink (cooling section)
28 heat sink (cooling section)
30 main housing (body section)
38 reaction chamber
66 fourth gas flow path (emission port)
140 fixing mechanism (attachment section) energy required for heating gas.

The invention claimed is:
1. A plasma generation device comprising:
a body section including a reaction chamber in which processing gas is converted into plasma by electric discharge;
a cooling section including a flow path with an inlet and an outlet, the cooling section being configured to cool the body section by using a fluid flowing in the flow path;
an emission port formed in the body section and through which plasma gas that is converted into plasma in the reaction chamber is emitted;
a heater configured to heat the fluid used to cool the body section downstream of the outlet of the cooling section; and
an emission device configured to emit the fluid heated by the heater onto the plasma gas emitted from the emission port.
2. The plasma generation device according to claim 1, wherein the flow path is formed such that a fluid flows away from the reaction chamber after flowing toward the reaction chamber.
3. The plasma generation device according to claim 1, wherein the body section has a rectangular parallelepiped shape, the emission device is disposed on one side surface among four side surfaces of the body section having the rectangular parallelepiped shape, an attachment section for attaching the plasma generation device to a predetermined location is disposed on a side surface opposite to the one side surface, and the cooling section includes a pair of cooling sections, the pair of cooling sections being disposed on two other side surfaces among the four side surfaces.

4. The plasma generation device according to claim 1, further comprising:

a gas pipe connected to the outlet of the cooling section, wherein the heater is disposed on an outer circumferential surface of the gas pipe to heat the fluid in the gas pipe.

5. The plasma generation device according to claim 1, wherein the fluid is air.

6. The plasma generation device according to claim 1, wherein the inlet of the cooling section includes a supply-side joint on an upper end surface of the cooling section, and the outlet of the cooling section includes a discharge-side joint on the upper end surface of the cooling section.

\* \* \* \* \*